(12) United States Patent
Cheng

(10) Patent No.: US 7,093,648 B1
(45) Date of Patent: Aug. 22, 2006

(54) HEAT PIPE COOLING DEVICE AND METHOD FOR MANUFACTURING THE SAME

(75) Inventor: Chih-Hung Cheng, Wugu Township, Taipei County (TW)

(73) Assignee: Golden Sun News Technologies Co., Ltd., Taipei County (TW)

( * ) Notice: Subject to any disclaimer, the term of this patent is extended or adjusted under 35 U.S.C. 154(b) by 0 days.

(21) Appl. No.: 11/313,913

(22) Filed: Dec. 22, 2005

(51) Int. Cl.
*H05K 7/20* (2006.01)

(52) U.S. Cl. .................................. 165/104.33; 361/700

(58) Field of Classification Search ........... 165/104.21, 165/104.33; 361/700
See application file for complete search history.

(56) References Cited

U.S. PATENT DOCUMENTS

| | | | |
|---|---|---|---|
| 6,625,021 B1* | 9/2003 | Lofland et al. | 361/697 |
| 6,830,098 B1* | 12/2004 | Todd et al. | 165/104.33 |
| 6,915,844 B1* | 7/2005 | Chou | 165/104.33 |
| 6,938,682 B1* | 9/2005 | Chen et al. | 165/104.33 |
| 6,945,319 B1* | 9/2005 | Li et al. | 165/104.33 |
| 2003/0218849 A1* | 11/2003 | Mochizuki et al. | 361/103 |
| 2004/0035558 A1* | 2/2004 | Todd et al. | 165/104.26 |
| 2005/0257920 A1* | 11/2005 | Sheng et al. | 165/104.33 |
| 2006/0082972 A1* | 4/2006 | Kim | 361/709 |

FOREIGN PATENT DOCUMENTS

| | | | |
|---|---|---|---|
| JP | 10107192 A | * | 4/1998 |
| JP | 10107193 A | * | 4/1998 |

\* cited by examiner

*Primary Examiner*—Allen J. Flanigan

(57) ABSTRACT

A heat pipe cooling device includes a heat conductor base, heat pipes and a cooling body. The heat conductor base further includes a base with multiple trenches and an upper cover. The heat pipes include a heat reception end and a cooling end. When the heat reception end of the heat pipes is contained in the trenches of the base, the bottom portion of the heat reception end tightly contacts the trenches. The upper cover includes multiple through holes and compressive portions formed between each pair of the through holes. The upper cover and the base are then tightly combined. The cooling end of the heat pipe penetrates the through hole. The compressive portion between the through holes is securely affixed above the heat reception end of the heat pipes. A cooling body is connected to the cooling end of the heat pipe, thereby forming the heat pipe cooling device.

9 Claims, 6 Drawing Sheets

HEAT PIPE COOLING DEVICE AND METHOD FOR MANUFACTURING THE SAME

BACKGROUND OF THE INVENTION

The present invention relates generally to a cooler, and more particularly to a heat pipe cooling for dissipating heat generated from an electronic device.

The operation of all electronic devices generates heat either due to conversion efficiency or friction. In particular, the modern technology has made possible more and more miniaturized electronic products, such as integrated circuits and personal electronic devices, the heat generated therefrom thus become more and more concentrated. For example, as a result of the continuous performance enhancement of personal computers, the heat generated from a personal computer is no longer restricted to the central processing unit. Other chipsets, such as chip modules, image processing units, dynamic memories and hard disks, also contribute significantly to the overall generated heat. Therefore, an additional cooling device is needed for ensuring that the personal computer is operated within the working temperature range, thereby preventing the personal computer from malfunctioning.

Heat pipes are the mostly employed cooling device in a miniaturized electronic product. The cooling device is made of materials of high heat conductivity. The cooperation between the working fluid and the capillary structured disposed in the heat pipe renders the heat pipe to have high heat conductivity and a reduction of the weight thereof. Therefore, such a cooling device does not have the problems of noise, heavy weight, too costly and structural complexity. In addition, such a cooling device can massively transfer heat without consuming electricity. For the reasons set forth above, the heat pipe cooling device has become the standard cooling device. However, conventional heat pipe cooling device is adhered to a heat generating electronic element via a heat conductor. The heat conductor transfers the heat to the heat pipe. Then, the working fluid in the heat pipe is vaporized due to the absorbed heat, thereby transferring the heat to the cooling body. Next, the vaporized working fluid is condensed and returns to the original position along the capillary structure. Since a heat conductor is required to absorb and transfer heat to the heat pipe, the overall heat transfer process is too long. Therefore, the heat transfer speed is rather limited.

One conventional heat pipe cooling device includes a cooling body, a heat pipe and a heat conductor. The cooling body includes a plurality of cooling fins stacked with each other, each cooling fin having a through hole formed thereon. The heat pipe includes a heat reception end and a cooling end. The cooling end of the heat pipe penetrates through the through holes of the cooling fins. A plurality of concave grooves is formed on the heat conductor, which is contained in the heat reception end of the heat pipe. Before the heat reception end of the heat pipe is disposed in front of the concave groove, a metallic material of low melting point is coated on the concave groove. The heat reception end of the heat pipe is then disposed in the concave groove. Later, the combination is sent to an hot oven for securely fastening the heat pipe to the heat conductor, thereby forming a heat pipe cooling device. The surface of the heat pipe is blacken due to the heating process in the oven. Therefore, an oxidation reduction process is required for recovering the heat pipe to its original color.

The heat pipe of the heat pipe cooling device described above is disposed in the heat conductor, so as to shorten the heat transfer path and increase the heat transfer rate. However, a metallic material of low melting point is required to be coated on the concave groove of the heat conductor. In addition, a hot oven is used to securely fasten the heat pipe with the heat conductor. These processes will increase the fabrication and the material cost for coating the metallic material and for heating in the oven. Moreover, the heating process in the oven will blacken the surface of the heat pipe. An additional oxidation reduction process is thus required, which will largely increase the manufacturing cost and lower the production efficiency.

BRIEF SUMMARY OF THE INVENTION

In light of the drawbacks mentioned above, the present invention is to provide a heat pipe cooling device and a method for manufacturing the same. The heat pipe is sandwiched between a heat conductor base and an upper cover, so as to contact the heat pipe directly to the heat conductor base, thereby rapidly dissipating heat generated from the heat source. In this manner, no heating process is required to combine the heat pipe and the heat conductor base. Since no heating process is required, the surface of the heat pipe will not be blacken during the manufacturing process. Therefore, no oxidation reduction process is necessary to recover the color of the heat pipe surface. This method can largely reduce the time and the money involved in the fabrication of the heat pipe cooling device.

DETAILED DESCRIPTION OF THE INVENTION

In order to better understanding the features and technical contents of the present invention, the present invention is hereinafter described in detail by incorporating with the accompanying drawings. However, the accompanying drawings are only for the convenience of illustration and description, no limitation is intended thereto.

Figure 1:
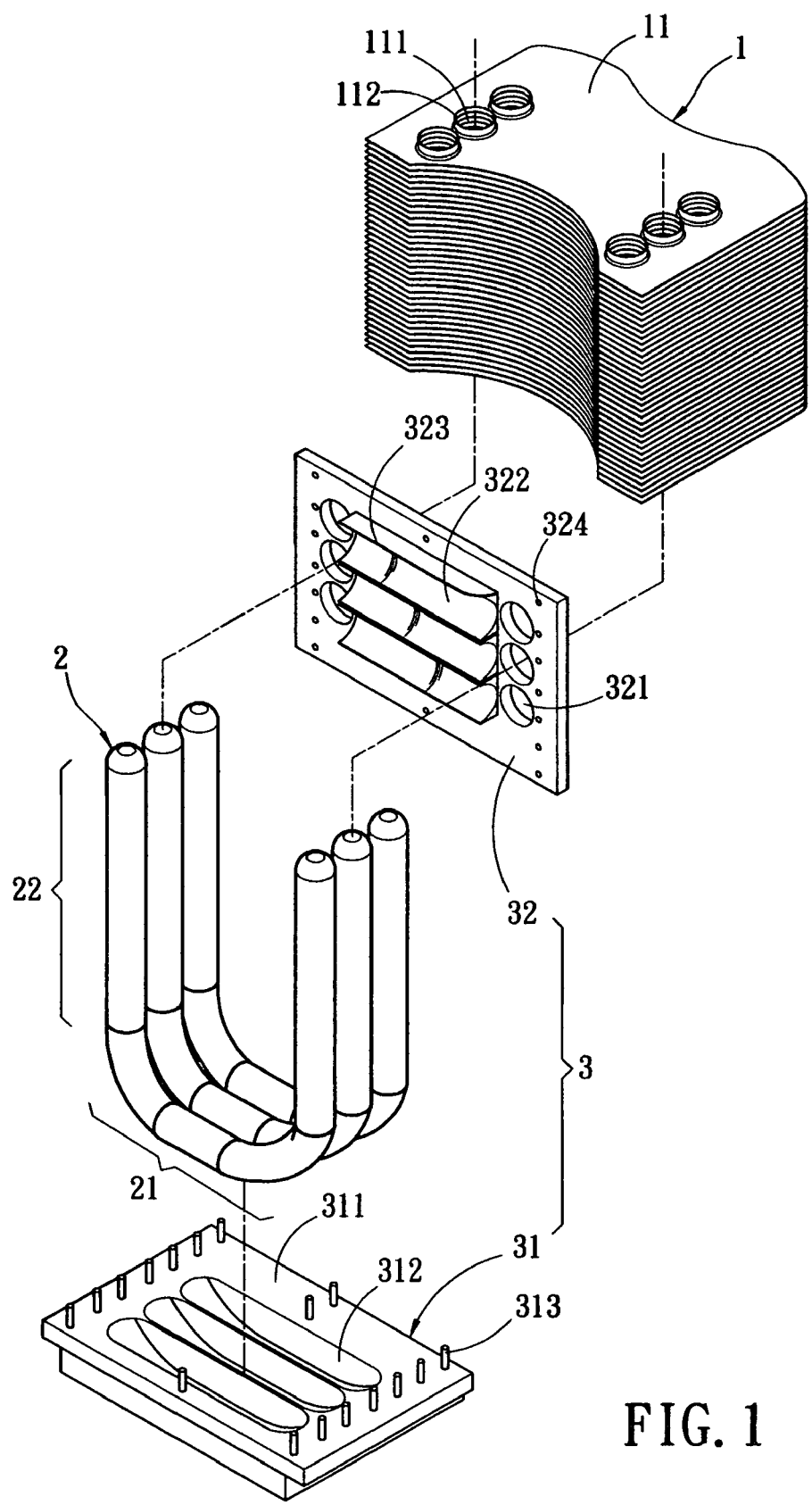
FIG. 1 is an explosive view illustrating a heat pipe cooling device of the present invention.

Referring to FIG. 1, an explosive view of a heat pipe cooling device of the present invention is illustrated. The heat pipe cooling device includes a cooling body 1, one or more heat pipes 2 (three heat pipes are shown in FIG. 1) and a heat conductor base 3, wherein the cooling body 1 includes a plurality of cooling fins 11 stacked with each other. The cooling fins 11 is made of highly heat-conductive materials such as copper or aluminum. The cooling fins can be of rectangular shape or any geometrical shape that is appropriate. At the same position of each cooling fin 11, a plurality of through holes 111 is formed. A circular protrusive ring 112 is formed around the edge of the through hole 111 extended upward therefrom. The height of each circular protrusive ring 112 is equal. In this manner, a equally spaced cooling channel is formed between two adjacently stacked cooling fins 11. In this particular embodiment, the heat pipe 2 is in U-shape, which includes a capillary structure and a working fluid disposed therein. A heat reception end 21 and a cooling end 22 is formed at the exterior of the heat pipe 2. Finally, the heat conductor base 3 includes a base 31 and an upper cover 32. The base 31 is made of a heat conductive material, such as aluminum. The base 31 includes a flat board 311. The flat board 311 includes a plurality of trenches 312 formed thereon. The shape and size of the trenches 312 are substantially the same as that of the heat reception end 21 of the heat pipe 2. A plurality of rivets 313 is disposed on the left and right sides, and the central portion of the base 31. The upper cover 32 is flat corresponding to the base 31, and is made of the same material of the base 31. A plurality of penetrating holes 321 is formed on the upper cover 32, and a compressive portion 322 is formed between each pair of the penetrating holes 321. A plurality of curved clip 323 is formed below the compressive portion 322. In addition, a plurality of holes 321 is formed on the flat board for combining with the rivets 313.

Figure 2:
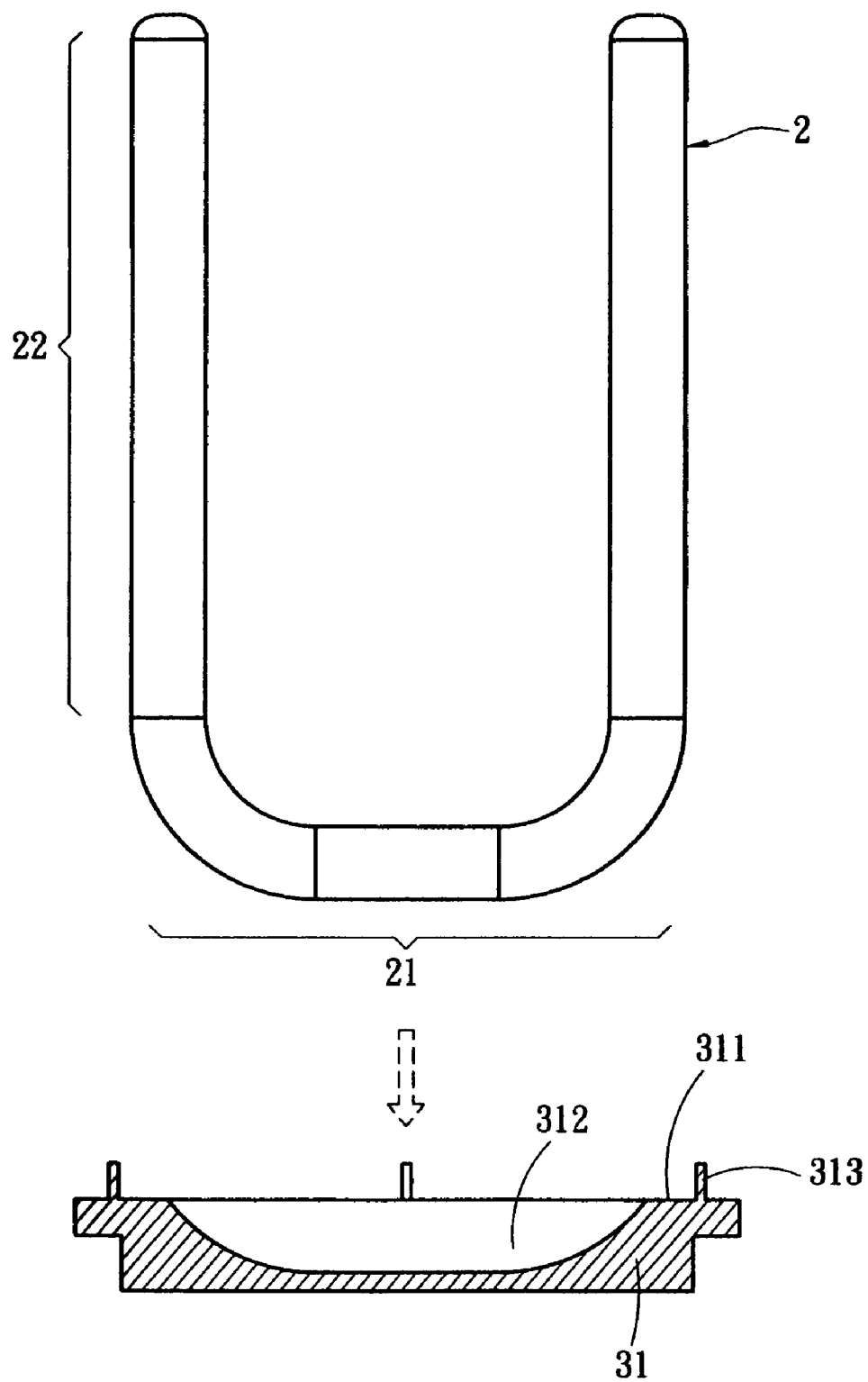
FIG. 2 illustrates the combination of the heat pipe and the base of the present invention.
Figure 3:
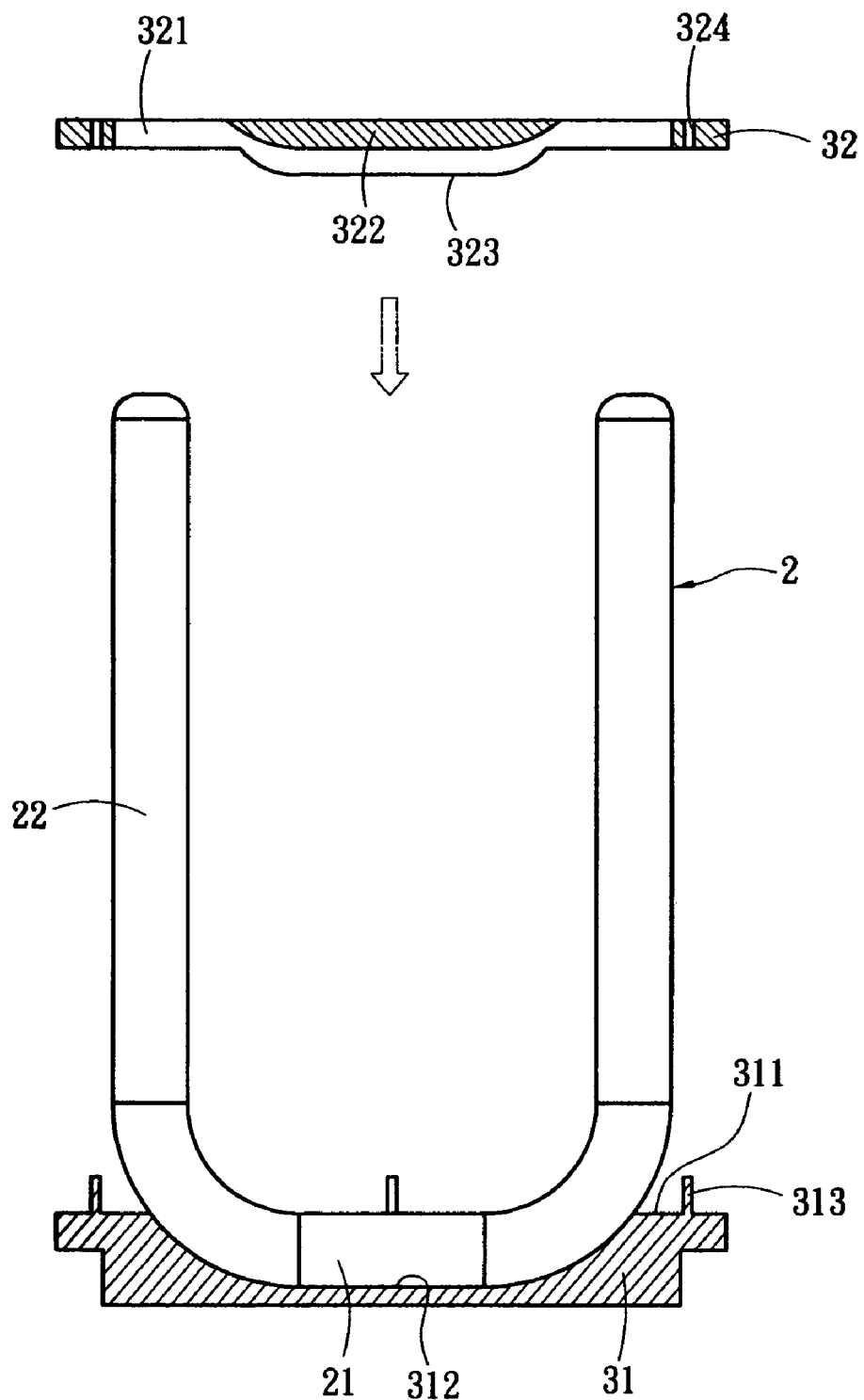
FIG. 3 illustrates the combination of the base and the upper cover of the present invention.
Figure 4:
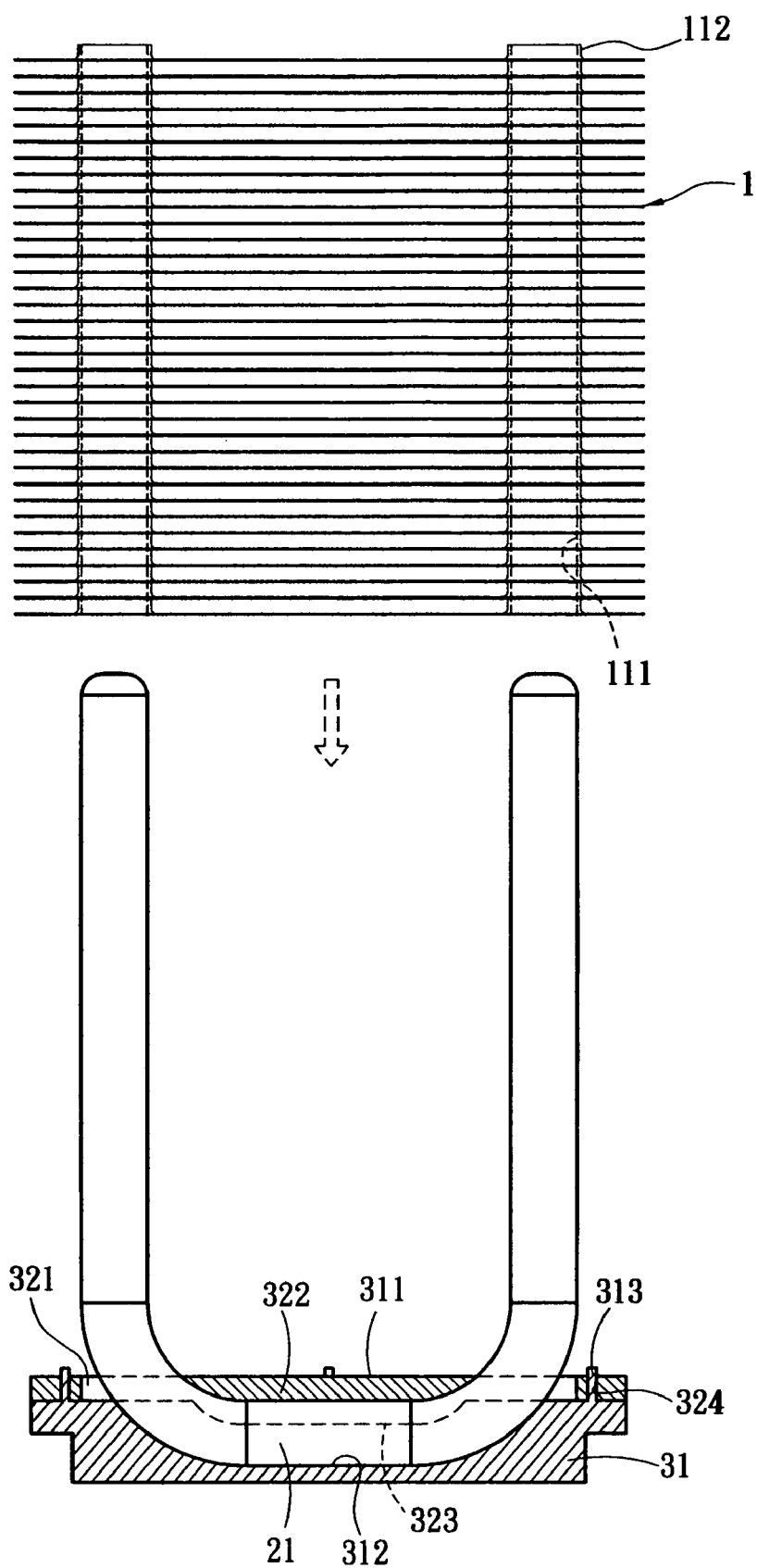
FIG. 4 illustrates the combination of the cooling body and the heat pipe of the present invention.

Referring to FIG. 2 to FIG. 6, the manufacturing processes of the heat pipe cooling device of the present invention are illustrated. Referring to FIG. 2, the heat pipe 2 is first disposed on the base 31. The base of the heat pipe 2 including the heat reception end 21 is tightly combined with the trenches 312 of the base 31, as shown in FIG. 3. The cooling ends 22 of the heat pipes 2 then penetrate the through holes 321 of the upper cover 32 until the upper cover 32 is tightly combined with the base 31. Meanwhile, the compressive portion 322 of the upper cover 32 contacts the upper portion of the heat absorption end 21 of the heat pipe 2. The clips 323 below the compressive portion 322 is then securely fastened to the two sides of the heat absorption end 21. The rivets 313 on the base 31 then penetrates the holes 324 of the upper cover 32, thereby securely combining the base 31 and the upper cover 31. In addition, the cooling end 22 of the heat pipe 2 can penetrate through the through holes 321 of the upper cover 31 prior to being dispose on the base 31. The heat absorption end 21 of the heat pipe 2 is then disposed in the trenches 312 of the base 31. Moreover, the combination of the base 31 and the upper cover 32 described above can also be achieved by using, for example, a screw element, a welding process or an adhesive.

Figure 5:
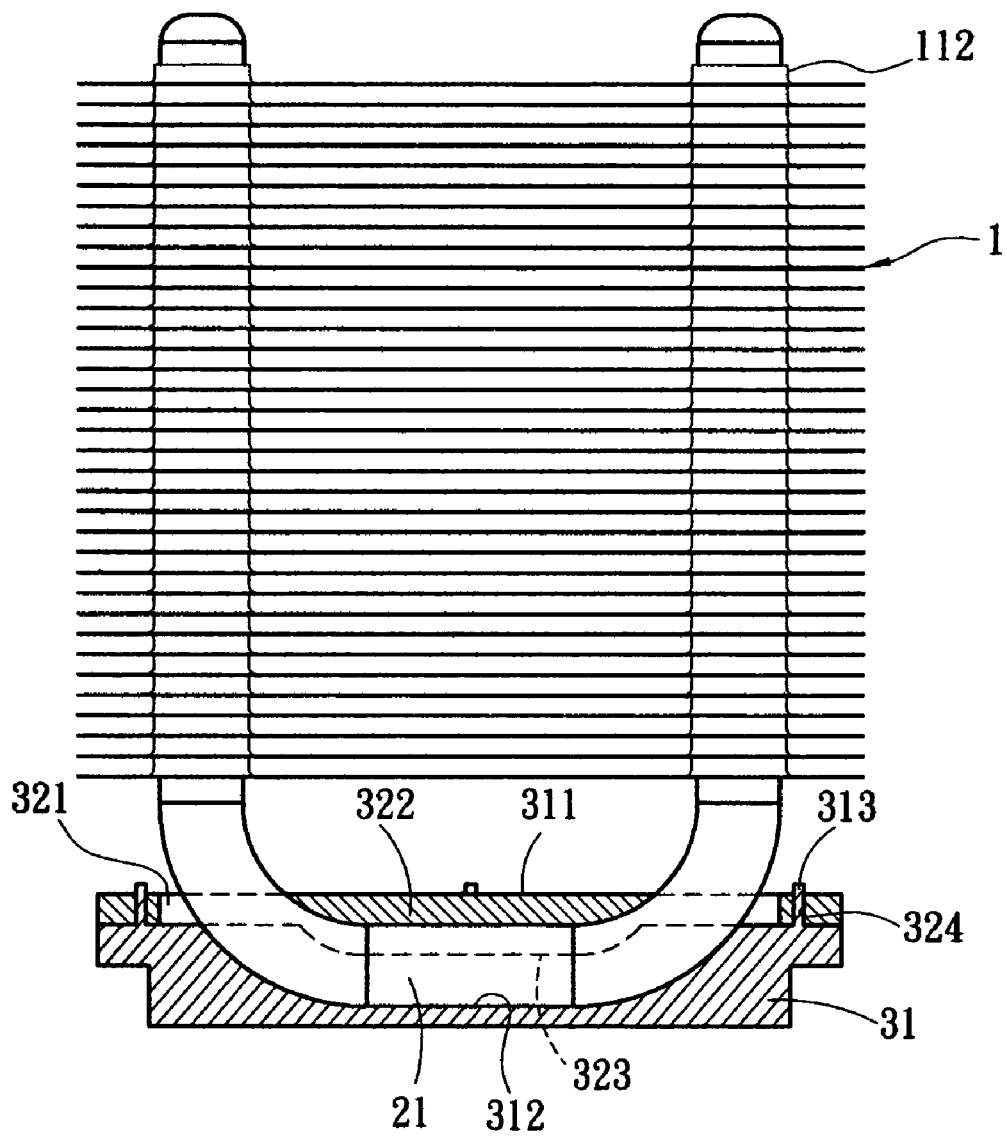
FIG. 5 illustrates the combination of the cooling body and the heat pipe of the present invention.
Figure 6:
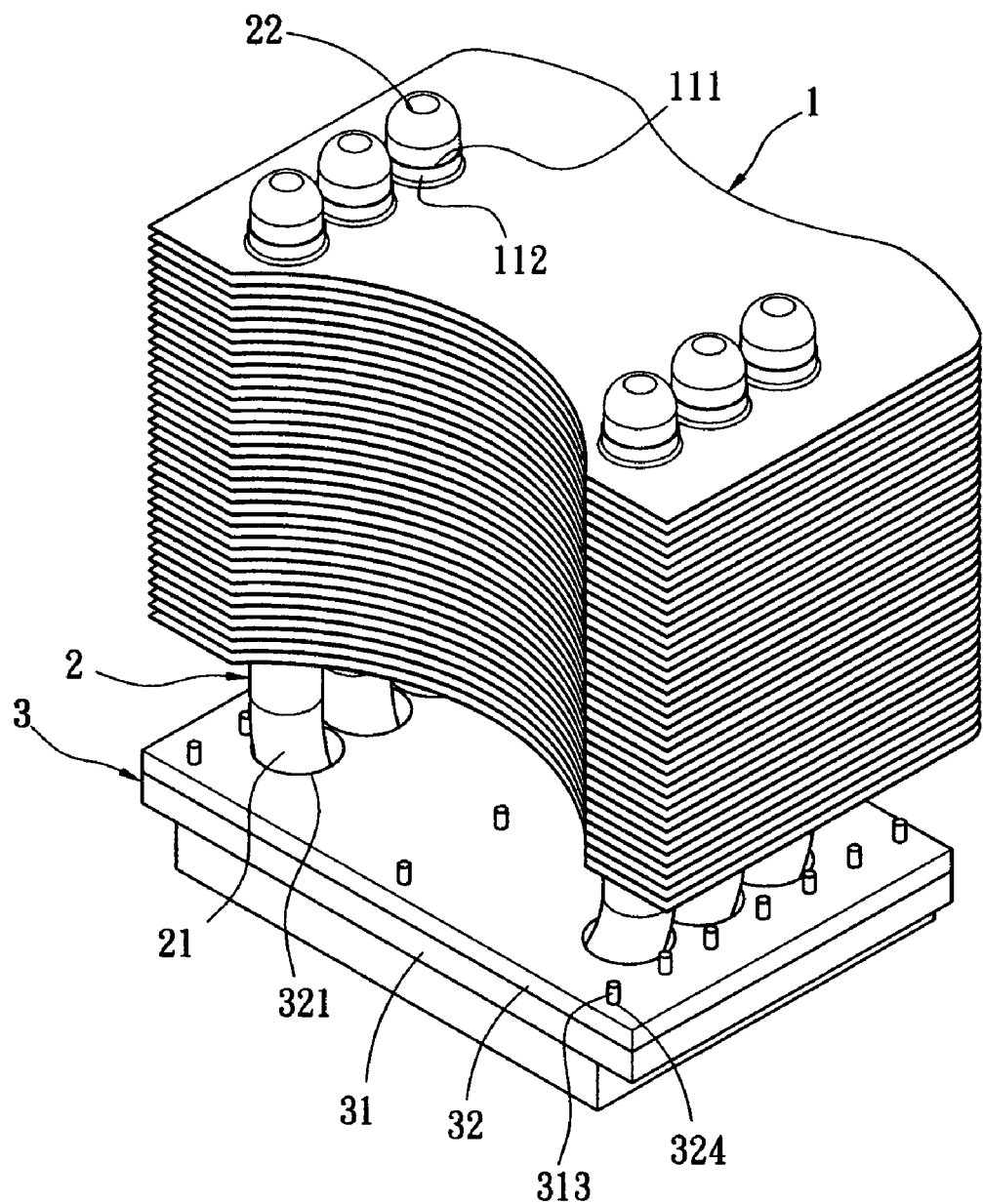
FIG. 6 is a perspective view illustrating the heat pipe cooling device of the present invention.

Referring to FIG. 5, the cooling fins 11 are stacked with each other to form a cooling body 1 after the heat pipe 2 is secured between the base 31 of the heat conductor base 3 and the upper cover 32. The through holes 111 of the cooling fins 11 are aligned to the cooling ends 22 of the heat pipes 2 and is penetrated therethrough until the cooling end 22 of the heat pipe 2 protrudes above the cooling body 1, as shown in FIG. 6. On the other hand, the cooling fins 11 can also be disposed to the heat pipe 2 by stamping each of the cooling fins 11 to stack with each other.

Referring to FIG. 6, a perspective view of the heat pipe cooling device of the present invention is illustrated. When the heat conductor base 3 contacts a heat generating electronic element, the heat conductor base 3 and the heat pipe 2 absorb the heat and rapidly transfer the heat away from the electronic element. The heat is then dissipated through the cooling fins 11 of the cooling body 1, thereby maintaining the electronic element within a working temperature.

Since, any person having ordinary skill in the art may readily find various equivalent alterations or modifications in light of the features as disclosed above, it is appreciated that the scope of the present invention is defined in the following claims. Therefore, all such equivalent alterations or modifications without departing from the subject matter as set forth in the following claims is considered within the spirit and scope of the present invention.

What is claimed is:

1. A heat pipe cooling device, comprising:
   a cooling body;
   at least a heat pipe, which includes a heat reception end and a cooling end, the cooling end contacting the cooling body; and
   a heat conductor base, which includes a base and an upper cover, the base comprising at least a trench formed thereon for containing the heat reception end of the heat pipe therein, the upper cover being a flat board, which includes a plurality of through holes formed thereon and a compressive portion formed between each pair of the through holes, the cooling end of the heat pipe penetrating the through holes of the upper cover allowing the compressive portion of the upper cover to contact the upper portion of the heat reception end of the heat pipe.

2. The heat pipe cooling device as recited in claim 1, wherein the cooling body comprises a plurality of cooling fins stacked with each other.

3. The heat pipe cooling device as recited in claim 2, wherein the cooling fins are made of aluminum or copper.

4. The heat pipe cooling device as recited in claim 1, wherein two sides of the compressive portion of the upper cover further comprises a plurality of clips.

5. The heat pipe cooling device as recited in claim 1, wherein the heat conductor base is made of aluminum.

6. A method for fabricating a heat pipe cooling device, comprising the steps of:
   disposing a heat reception end of a heat pipe to a trench of a base;
   penetrating cooling ends of the heat pipe through the through holes of an upper cover;
   fastening the base with the upper cover and contacting the compressive portion of the upper cover to the upper portion of the heat reception end of the heat pipe; and
   disposing a cooling body to the cooling end of the heat pipe, thereby completing the fabrication process.

7. The method as recited in claim 6, wherein the base and the upper cover are fastened by a soldering process, a rivet or an adhesive.

8. The method as recited in claim 6, wherein the upper cover is fastened to the base via a screw element.

9. The method as recited in claim 7, wherein the cooling body is stamped onto the heat pipe.

* * * * *